United States Patent
Sato et al.

(10) Patent No.: US 7,179,733 B2
(45) Date of Patent: Feb. 20, 2007

(54) METHOD OF FORMING CONTACT HOLES AND ELECTRONIC DEVICE FORMED THEREBY

(75) Inventors: Mitsuru Sato, Chino (JP); Ichio Yudasaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 48 days.

(21) Appl. No.: 10/795,366

(22) Filed: Mar. 9, 2004

(65) Prior Publication Data
US 2004/0242008 A1    Dec. 2, 2004

(30) Foreign Application Priority Data
Mar. 17, 2003 (JP) .............................. 2003-072498
Jan. 21, 2004 (JP) .............................. 2004-013228

(51) Int. Cl.
*H01L 21/4763* (2006.01)
(52) U.S. Cl. ..................................... 438/622; 257/774
(58) Field of Classification Search ................ 438/620, 438/622; 257/774
See application file for complete search history.

(56) References Cited

U.S. PATENT DOCUMENTS

| | | | | |
|---|---|---|---|---|
| 4,185,294 | A * | 1/1980 | Sumitomo et al. | 257/752 |
| 5,032,528 | A * | 7/1991 | Asao et al. | 438/527 |
| 5,219,787 | A * | 6/1993 | Carey et al. | 438/637 |
| 5,723,381 | A | 3/1998 | Grewal et al. | |
| 6,010,955 | A * | 1/2000 | Hashimoto | 438/597 |
| 2002/0043889 | A1 * | 4/2002 | Inoue et al. | 310/313 B |
| 2002/0045311 | A1 * | 4/2002 | Mikawa | 438/240 |
| 2002/0063340 | A1 * | 5/2002 | Sahara et al. | 257/773 |
| 2003/0109126 | A1 * | 6/2003 | Terasawa et al. | 438/612 |
| 2004/0031962 | A1 * | 2/2004 | Hasegawa et al. | 257/58 |
| 2004/0082195 | A1 * | 4/2004 | Yudasaka et al. | 438/782 |
| 2004/0147066 | A1 * | 7/2004 | Yamazaki et al. | 438/151 |

FOREIGN PATENT DOCUMENTS

| | | |
|---|---|---|
| JP | A-02-090653 | 3/1990 |
| JP | A 3-136245 | 6/1991 |
| JP | A-07-122637 | 5/1995 |
| JP | A-07-122638 | 5/1995 |
| JP | A-07-161711 | 6/1995 |
| JP | A-08-124840 | 5/1996 |
| JP | A-09-069563 | 3/1997 |
| JP | A 9-312336 | 12/1997 |
| JP | A-10-112499 | 4/1998 |
| JP | A-10-116905 | 5/1998 |
| JP | A-11-186274 | 7/1999 |

(Continued)

*Primary Examiner*—Carl Whitehead, Jr.
*Assistant Examiner*—Colleen E. Rodgers
(74) *Attorney, Agent, or Firm*—Oliff & Berridge, PLC

(57) ABSTRACT

In a method of forming contact holes without using a vacuum device, a resist film at positions corresponding to contact hole forming regions above a source region 16, a drain region 18 and a gate electrode 34 of a polysilicon film 14, is exposed and developed to form mask pillars 40. Then a liquid insulating material is applied onto the whole surface of a glass substrate 10 except for the mask pillars 40, to form an insulating layer 42. Next the mask pillars 40 are removed by ashing, and an insulating layer 42, second contact holes 44 and first contact holes 28 which pass through a gate insulating film 26 are formed.

15 Claims, 5 Drawing Sheets

| | FOREIGN PATENT DOCUMENTS | | JP | A-2002-164635 | 6/2002 |
|----|----|----|----|----|----|
| JP | A-2000-003883 | 1/2000 | KR | P 1994-0010199 | 5/1994 |
| JP | A-2000-269336 | 9/2000 | | | |
| JP | A 2001-267320 | 9/2001 | * cited by examiner | | |

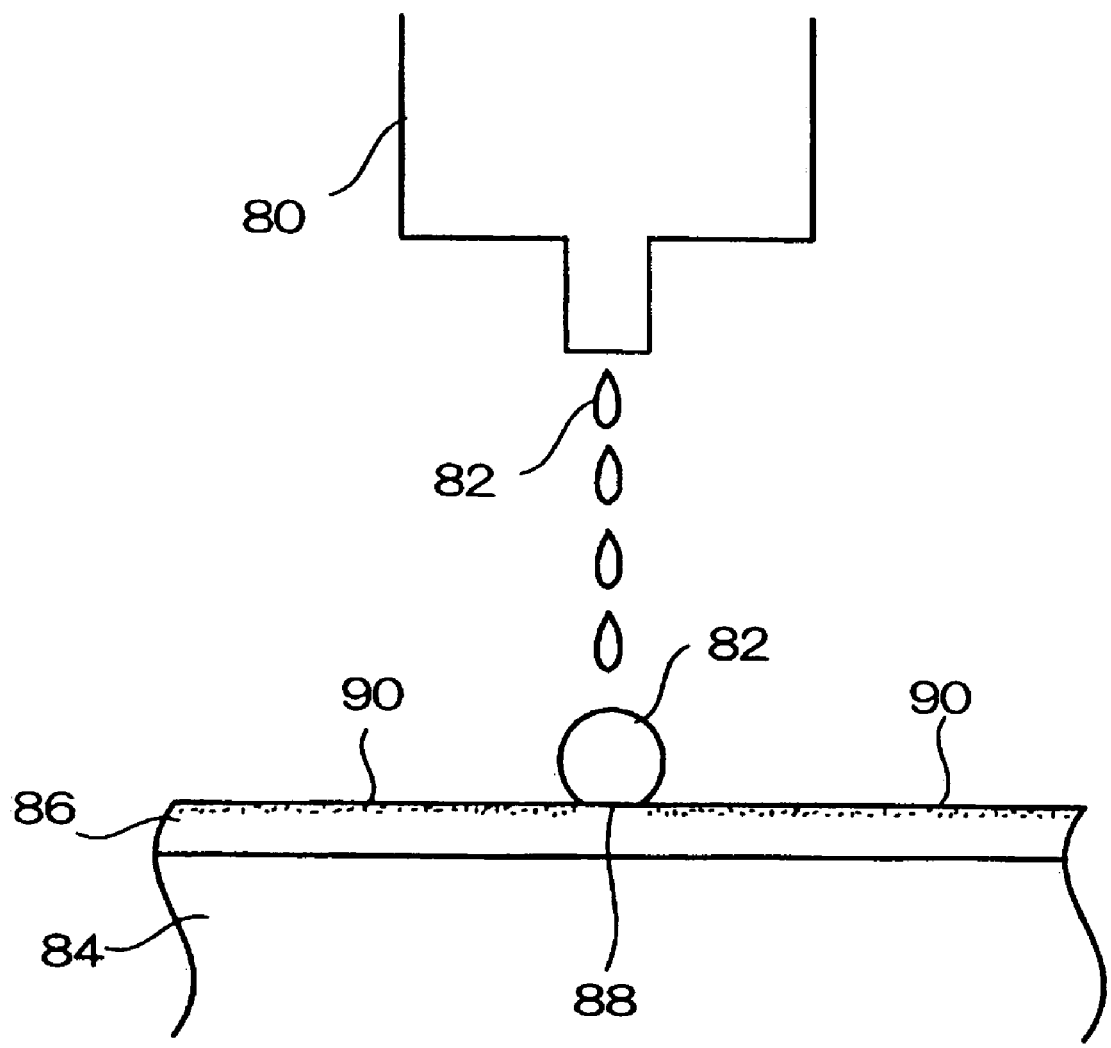

METHOD OF FORMING CONTACT HOLES AND ELECTRONIC DEVICE FORMED THEREBY

FIELD OF THE INVENTION

The present invention relates to a method of forming contact holes which are formed in an interlayer insulating film or the like of a semiconductor device, and a manufacturing method for thin film semiconductor devices, a manufacturing method for electronic devices, and electronic devices.

DESCRIPTION OF THE RELATED ART

Recently, regarding semiconductor devices, being electronic devices, wiring is multilayered in order to realize high integration. Moreover, in a semiconductor device having multilayered wiring, in the case of electrically connecting upper and lower wiring patterns arranged via an interlayer insulating film, contact holes are formed in the interlayer insulating film so that they can be connected via the contact holes. Conventionally, contact holes are generally formed in the following way as disclosed in Patent Reference 1.

Firstly, a conductive material such as a metal is film formed on a substrate, and is etched in order to form a lower wiring layer. Next, an interlayer insulating film is formed on the lower wiring layer. Then, a photoresist film is applied onto the interlayer insulating film, and this is exposed and developed by a photolithographic method in order to form a resist film where parts corresponding to the contact holes are opened. Next, the interlayer insulating film is dry etched with the resist film as a mask to provide openings which penetrate the interlayer insulating film and thereby form the contact holes. Then, the resist film is removed and an upper wiring layer electrically connected to the lower wiring layer via the contact holes, is formed on the interlayer insulating film.

[Patent Reference 1] Japanese Unexamined Patent Application, First Publication No. 2001-267320

As mentioned above, the conventional contact holes are formed by applying a photoresist onto an insulating film and patterning, dry etching the insulating film with the patterned resist film as a mask, and thus providing through holes in the insulating film. Therefore, the conventional method of forming contact holes requires an expensive vacuum device for dry etching the insulating film. Moreover, since it is a process using a vacuum device, much time, labor, and energy are required in order to form the contact holes, and maintenance of the vacuum device is not easy.

Moreover, there has been a problem when dry etching in that plasma damage occurs due to, impact of charged particles on the substrate, charge storage on the substrate surface, and the like, so that the electrical characteristic of the semiconductor device are deteriorated. Furthermore, there is a problem with dry etching in that it is difficult to sufficiently maintain the selection ratio in etching between the insulating film and the lower conductive film, and therefore there is a problem in that the lower conductive film is etched and the ohmic electrical conduction can not be removed. Furthermore, there is also a problem in that the photoresist is cured when dry etching, which makes it difficult to remove the photoresist after etching.

SUMMARY OF THE INVENTION

The present invention addresses the abovementioned problems of the conventional techniques, with an object of forming contact holes without using a vacuum device.

In order to achieve the above object, the method of forming contact holes according to the present invention is a method of forming contact holes for electrically connecting a first conducting section and a second conducting section which are provided via an insulating film, and is characterized in having; a mask forming step for providing a mask material on a contact hole forming region on the first conducting section; an insulating film forming step for forming an insulating film on the whole surface of the substrate except for the mask material; and a mask material removing step for removing the mask material and forming a through hole in the insulating film.

That is to say, in the present invention, after mask material is provided on a position for forming a contact hole, an insulating film is formed on the surroundings. Then, when the mask material is removed, a through hole is formed in the insulating film, and hence this can be a contact hole. Therefore, according to the present invention, the insulating film does not need to be dry etched for forming the contact holes, and hence an expensive vacuum device is not needed. Accordingly, the contact holes can be quickly formed, and labor and energy for forming the contact holes can be reduced, so that the cost of an electronic device can be reduced. Moreover, in the present invention, since the method called dry etching is not used, problems such as plasma damage or curing of the photoresist do not occur. Furthermore, in the present invention, the lower conductive layer is only exposed to the remover of the mask material (for example, photoresist), and the conductive layer is not etched. Therefore, it becomes possible to form stable contact holes.

The mask forming step may have; a film forming step for forming a mask material film composed of the mask material on the whole surface of the substrate, and a patterning step for removing unnecessary parts of the mask material film to leave the mask material film only in the contact hole forming region.

Alternatively, the mask forming step may have; a selective application step for selectively supplying liquid material containing mask forming material to the contact hole forming region, and a solidification step for solidifying the liquid material which has been applied. In this case, since a removing step is not necessary, the manufacturing process is simplified. The selective application step process may be performed by a droplet discharge method using a droplet discharge device.

Moreover, the mask forming step may have; a surface treatment step for making the contact hole forming region lyophilic and the surroundings repelling, and the selective application step may be performed after the surface treatment step. In this case, it becomes possible to perform the selective application of liquid material to the lyophilic region more reliably.

In the case where the mask material comprises an organic material such as photoresist, the film forming process may have an application step for applying liquid organic material, and a solidification step for solidifying the liquid organic material to form an organic film, and the patterning step may have an exposing step for exposing the organic film, and a developing step for developing the organic film which has been exposed. Therefore, the manufacturing steps for conventional semiconductor devices can be utilized as is, so that the burden of new equipment cost can be avoided. The liquid organic material can be applied by so-called spin coating, dip coating, or the like. As the liquid organic material, organic material which is dispersed or dissolved in a predetermined solvent, or when the material before curing is liquid form, its liquid form organic material, can be used.

Moreover, in the case where the mask material is an organic material, preferably the mask forming step has a selective application step for selectively supplying liquid organic material to the contact hole forming region, and a solidification step for solidifying the liquid organic material which has been applied. The liquid organic material can be selectively supplied to the contact hole forming region by a quantitative discharge device such as a printer head of an inkjet printer. In the case where the liquid organic material is selectively supplied to the contact hole forming region, it is desirable to perform a surface treatment step for making the contact hole forming region lyophilic and the surroundings liquid-repelling, and then perform the selective application step. As a result, it becomes possible to increase the wettability and the adhesiveness of the liquid organic material to the contact hole forming region and to prevent the liquid organic material from outspreading to the surroundings, so that the mask material can be reliably arranged on the contact hole forming region.

In the case where the mask material is composed of an organic material such as photoresist, it is preferable to provide a curing step involving arranging the mask material which is provided on the contact hole forming region, under an atmosphere where oxygen and moisture do not substantially exist, and heating up the mask material to a predetermined temperature and irradiating ultraviolet rays onto the mask material. Specifically, the curing process can be performed under a reduced-pressure. If the mask material is arranged under a reduced-pressure, moisture dissolved into the mask material comes out from the mask material. Then, by the irradiation of ultraviolet rays, the cross-linking reactions can be promoted without being affected by moisture, so that the mask material can be made precise, and heat resistance and the chemical resistance can be improved. After the curing process, a heat treatment step for heating up the mask material to a predetermined temperature or more, may be added. Accordingly, the mask material can be made even more precise, and superior in heat resistance and chemical resistance, and at the same time outgassing from the mask material can be reduced in the heat treatment process in the subsequently performed insulating film forming step.

Furthermore, it is desirable to subject the mask material comprising an organic material to a liquid-repelling treatment. If the mask material is subjected to a liquid-repelling treatment, in the case where an insulating film is formed by applying a liquid insulating material, adhering of the liquid insulating material onto the upper surface of the mask material can be prevented, and the mask material can be easily removed. The liquid-repelling treatment can be performed by bleaching the mask material with activated fluorine or the like. The active fluorine can be easily obtained by generating a plasma in an atmospheric pressure state (so-called atmospheric pressure plasma) from a fluoro gas such as carbon tetrafluoride ($CF_4$). If the mask material is formed by a liquid-repelling photoresist, the liquid-repelling treatment is unnecessary.

In the case where the mask material is an inorganic material such as aluminum, the film forming step may involve film forming the inorganic mask material on the substrate by for example deposition or the like in order to form the mask material film, and the patterning step may involve pattern forming the mask material film by for example photoetching. Vacuum deposition, physical deposition such as sputtering, or chemical deposition such as CVD can be used for the deposition of the inorganic mask material onto substrate. The abovementioned photoetching is a method where a resist mask is formed onto the upper surface of the mask material film by using a photolithographic method, and then the mask material film is etched using this resist mask.

The insulating film forming step for forming an insulating film may have an insulating material application step for applying liquid insulating material onto the substrate, and an insulating material solidification step for solidifying the liquid insulating material which has been applied. Therefore, it is possible to form an insulating film without using a vacuum device and the like, and the steps can be simplified and the cost reduced.

As the liquid insulating material used in this case, SOG (Spin On Glass) having a siloxane bond, polysilazane, polyimide, low dielectric material (so-called Low-K material) and the like can be used. Moreover, the liquid insulating material need not always have nonconductivity, provided that the finally obtained film is an insulating film. Furthermore, these liquid insulating materials can be an insulating film typically made by heat treatment, after being dissolved in an organic solvent and applied. Therefore, the insulating material solidification step preferably involves heating the liquid insulating material.

In removing the mask material in the mask material removing step, in the case where the mask material comprises organic material, the mask material can be removed by, ashing with oxygen plasma under atmospheric pressure or reduced pressure, ashing with ozone, or with normal photoresist peeling liquid. Moreover, in the case where the mask material comprises inorganic material, the mask material can be removed by soaking in an etchant capable of dissolving this inorganic material. Of course this can be spin etched. In removing the mask material by such methods, a method which has no affect at all on the lower conductive layer can be selected. Therefore the contact holes can be stably opened.

Next, assuming that a plurality of layers of the insulating films are formed, then the method may include: a first mask material forming step for providing a first mask material on a contact hole forming region on the first conducting section; a first insulating film forming step for forming a first insulating film on the whole surface of the substrate except for the first mask material; a first mask material removing step for removing the first mask material and forming a first through hole in the first insulating film; a second mask material forming step for providing a second mask material on the first through hole formed in the first insulating film; a second insulating film forming step for forming a second insulating film on the whole surface of the first insulating film except for the second mask material, and a second mask material removing step for removing the second mask material and forming a second through hole which is coaxial with the first through hole in the second insulating film. As a result, it becomes possible to form a contact hole through a plurality of insulating films, and it becomes possible to realize multilayer wiring which connects the first conductive layer to a third conductive layer for example.

Alternatively, assuming that the insulating film forms a plurality of layers, then the method may include: a first mask material forming step for providing a first mask material in the contact hole forming region on the first conducting section; a first insulating film forming step for forming a first insulating film on the whole surface of the substrate except for the first mask material; a second mask material forming step for providing a second mask material on the first mask material; a second insulating film forming step for forming a second insulating film on the whole surface of the first insulating film except for the second mask material; and a mask material removing step for removing the first mask material and second mask material and forming a through hole in the first insulating film and second insulating film. In this case also, it becomes possible to realize multilayer wiring having contact holes through a plurality of insulating films. Furthermore the manufacturing process is simplified compared to the above described method for forming and removing a mask material for each of the insulating films.

Next, the manufacturing method for a thin film semiconductor device of the present invention, is a manufacturing method for a thin film semiconductor device, for forming a thin film semiconductor device on a substrate, and it is characterized in having: a step for forming a semiconductor film containing a source and a drain region on the substrate; a step for providing a first mask material on a contact plug forming region on the source and the drain region; a step for applying liquid material onto the semiconductor film except for the contact plug forming region to form a gate insulating film; a step for removing the first mask material; a step for providing a second mask material where a gate electrode forming region is opened, on the gate insulating film; a step for applying liquid material to the gate electrode forming region which has been opened, to form a gate electrode; a step for removing the second mask material; a step for providing a third mask material on the contact plug forming region in the source and the drain region, and on a contact plug forming region in a gate electrode; a step for applying liquid material onto the gate electrode and the gate insulating film except for the contact plug forming region, to form an interlayer insulating film; a step for removing the third mask material; and a step for applying liquid material to the contact plug forming region to form a contact plug, after removing the third mask material. According to such a method, dry etching is not needed for forming a contact plug, and hence an expensive vacuum device is not needed. Accordingly, the contact plug can be quickly formed, labor and energy for forming the contact plug can be reduced, and the manufacturing cost of the thin film semiconductor device can be reduced.

In the abovementioned manufacturing method for a thin film semiconductor device, there may be; a step for providing a fourth mask material where an electrode forming region is opened, on the interlayer insulating film and the contact plug, and a step for applying liquid material to the electrode forming region which has been opened, to form an electrode.

Next, the manufacturing method for an electronic device of the present invention is a method which uses the abovementioned method of forming contact holes of the present invention, and is characterized in having: a step for filling a conductive material into the formed contact hole, and a step for forming wiring of predetermined patterns on the filled conductive material. By such a method, it becomes possible to easily manufacture electronic devices which are superior in electrical characteristics and highly reliable. In this case, the same or different types of conductive material can be used as the filling material for the contact hole and the forming material for the wiring.

Moreover, as a different aspect to the manufacturing method for an electronic device of the present invention, this may have a step for forming wiring of a predetermined pattern on the insulating layer including the contact hole, while filling conductive material into the formed contact hole. In this way, it becomes possible to simplify the manufacturing process by filling the contact hole and forming the wiring in the same step.

Moreover, an electronic device according to the present invention is characterized in having a contact hole formed by using the abovementioned method of forming contact holes. As a result, the abovementioned effects can be obtained.

BRIEF DESCRIPTION OF THE DRAWINGS

FIG. 5 is a flowchart of a contact hole forming method of a fourth embodiment.

DETAILED DESCRIPTION OF THE INVENTION

Preferred embodiments of a contact hole forming method according to the present invention, and an electronic device manufactured by using this method, are described in detail in accordance with the appended drawings.

Figure 1:
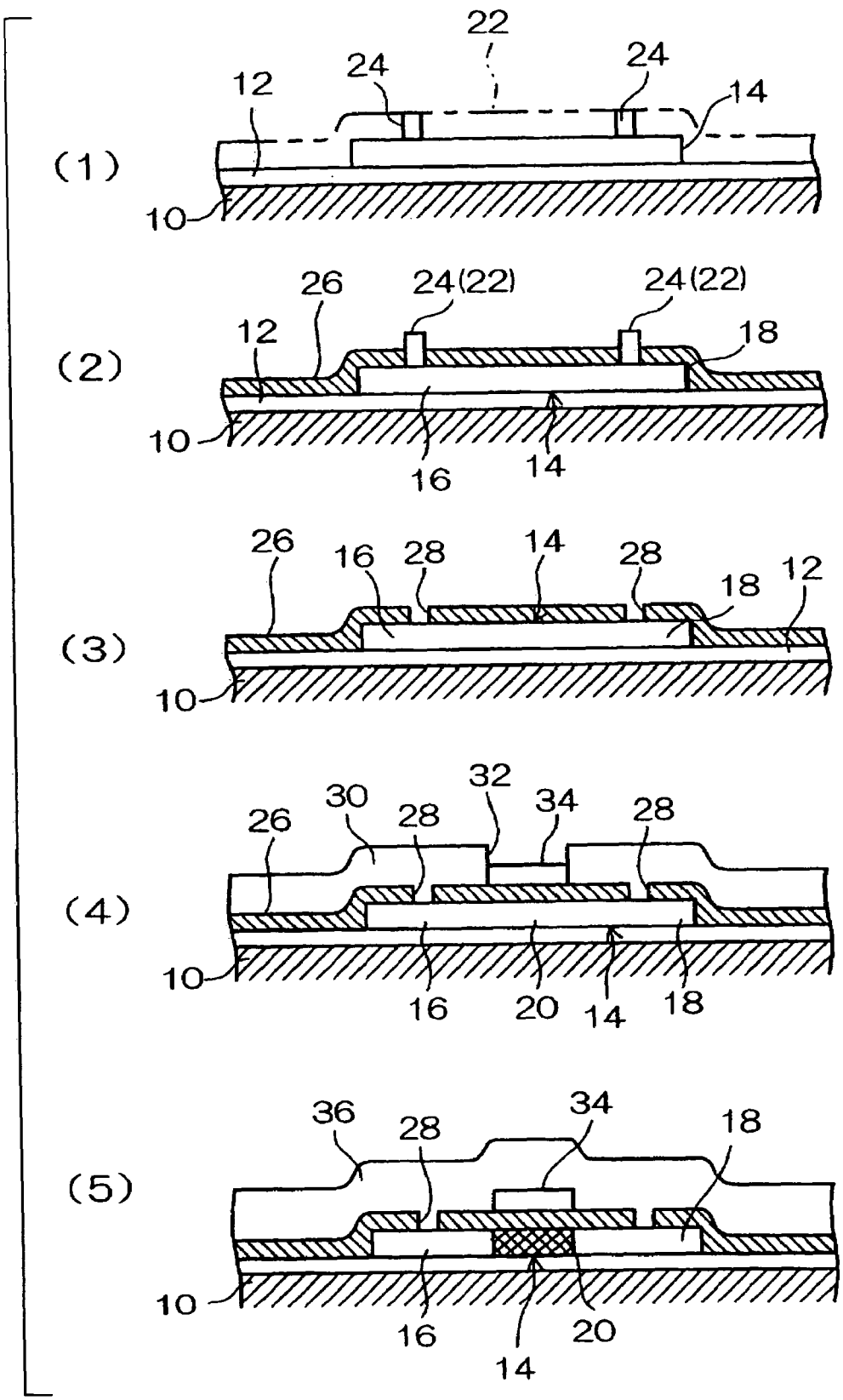
FIG. 1 is an explanatory diagram showing some of the manufacturing step for an electronic device, according to an embodiment.
Figure 2:
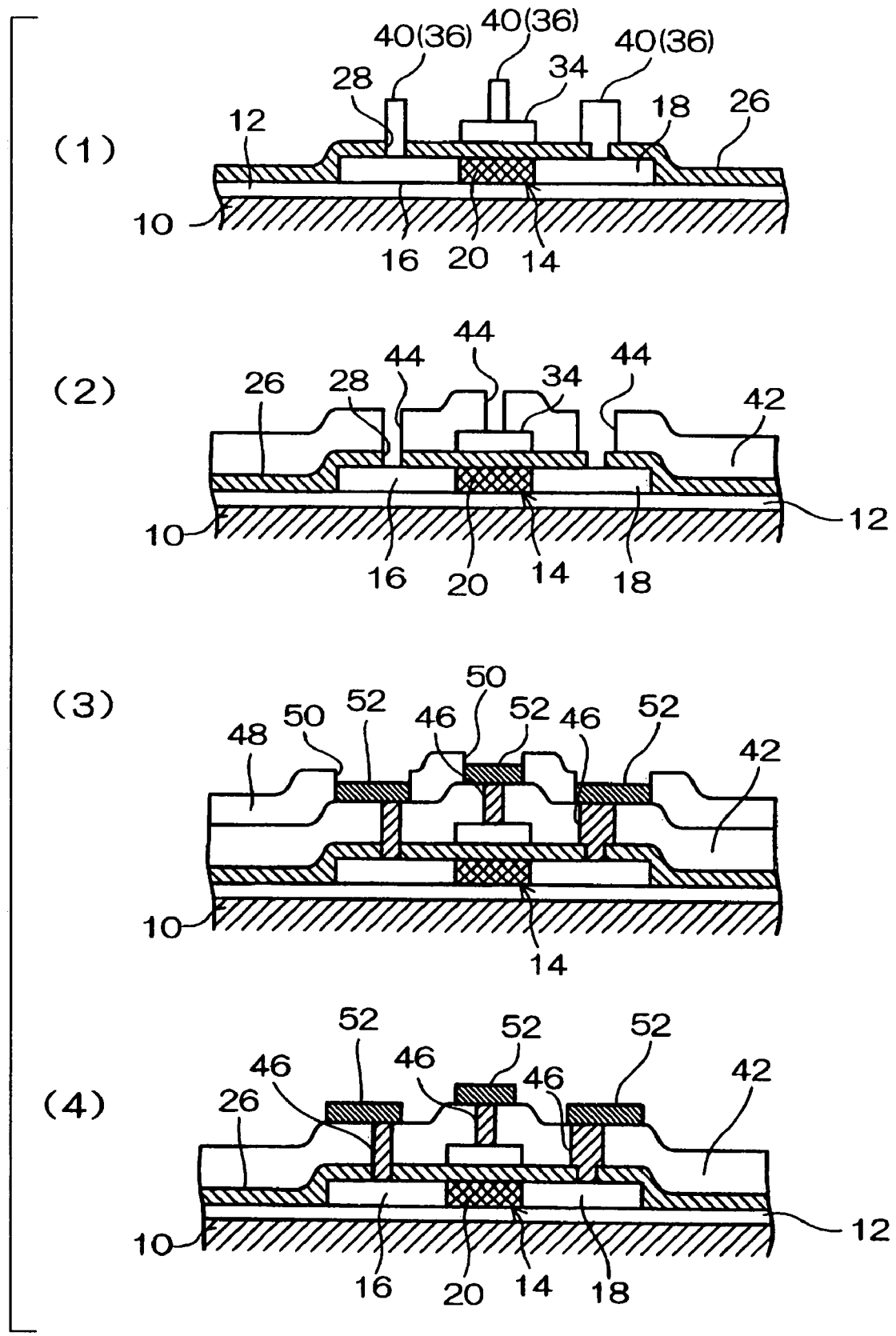
FIG. 2 is a diagram for explaining the steps following those of FIG. 1, of a first embodiment.

FIG. 1 and FIG. 2 are an example of manufacturing steps for an electronic device utilizing a contact hole forming method according to a first embodiment of the present invention. These manufacturing steps are those for where the contact hole forming method of the embodiment is applied when forming a switching circuit such as a liquid crystal panel or the like, and are a flow chart for a method for connecting a thin film transistor (TFT) comprising low temperature polysilicon (LTPS) to wiring.

Firstly, as shown in FIG. 1, a base insulation film 12 such as silicon dioxide is formed on the surface of a glass substrate 10. This base insulation film 12 can be formed by applying a liquid material containing an insulating material such as SOG having a siloxane bond (liquid insulating material) onto the glass substrate 10, and then baking for heat decomposition. Accordingly, there is no need to use an expensive vacuum device, and hence input energy and time required for film forming can be reduced. The liquid insulating material is applied by so-called spin coating in the case of the embodiment. However, the liquid insulating material can be also applied by dip coating, liquid source misted chemical deposition (LSMCD), slit coating, or the like.

Moreover, the liquid insulating material can also applied by a quantitative discharge device such as a printer head of a so-called inkjet printer. If this quantitative discharge device is used, it is possible to apply to only the desired part, and hence materials can be reduced. Furthermore, as the liquid insulating material, polysilazane, polyimide, Low-K material or the like which is dispersed or dissolved in a predetermined solvent such as xylene, can be used.

Next, a polysilicon film 14 is formed on the base insulation film 12. This polysilicon film 14 can be formed in the following way. Firstly, a liquid-repelling film such as fluoroplastic for example (not shown) is formed on the base insulation film 12. Then, ultraviolet rays are irradiated onto an element forming region of this liquid-repelling film, and the liquid-repelling film of the element forming region is decomposed and removed for pattering, in order to make liquid-repelling banks. Then, liquid silane is applied to the element forming region and dried.

Next, the dried liquid silane film is baked and heat decomposed in order to make amorphous silicon film. Furthermore, ultraviolet rays are irradiated onto the whole glass substrate 10 in order to decompose and remove the liquid-repelling banks. Then an excimer laser such as a XeCl laser is irradiated onto the amorphous silicon film for annealing, and the amorphous silicon film is multicrystalized in order to make the polysilicon film 14.

Next, to cover the polysilicon film 14 and the base insulation film 12, photoresist, which is liquid organic material, is applied to the whole surface of the glass substrate 10. Then, the applied photoresist is dried (prebake) at a temperature of 70 to 90° C. to form a resist film (mask material film) 22 as shown by the two-dot chain line in FIG. 1(1). The liquid organic material may be photosensitive resin (for example, polyimide). Moreover, the liquid organic material can be applied by spin coating, dip coating, LSMCD, slit coating, or with a quantitative discharge device, similarly to the application of the liquid insulating material as mentioned above.

Next, the resist film 22 is exposed and developed by a photolithographic method to leave the resist film 22 only in the contact hole forming regions on the polysilicon film 14, which become a first conducting section, in order to make mask pillars (mask material) 24. These mask pillars 24 are formed to a height equivalent to or greater than the thickness of the insulating film for forming the contact holes. Moreover, these may be formed higher than the application thickness of the liquid film forming material for forming the insulating film. Furthermore, a curing process is performed for the mask pillars 24 as necessary. In the case of the embodiment, the curing process of the mask pillars 24 is performed as follows.

Firstly, the glass substrate 10 where the mask pillars 24 are formed, is carried into a vacuum chamber (not shown), and the pressure in the vacuum chamber is reduced for example to 1.3 kPa (10 Torr) or less, for example to about 0.2 Torr. Then, the mask pillars 24 are heated up to a predetermined temperature, for example the post bake temperature of a normal photoresist, which is about 100 to 150° C. (for example 130° C.), and ultraviolet rays with a wavelength of about 254 nm are irradiated onto the mask pillars 24. As a result, moisture dissolved into the mask pillars 24 is dehydrated and the cross-linking reaction is promoted by the ultraviolet rays. Furthermore, since the mask pillars 24 are not affected by oxygen or moisture, they becomes precise as the cross-linking reaction progresses, and the heat resistance and the chemical resistance are improved.

Furthermore, regarding the curing process of the mask pillars 24, heat treatment for heating up the mask pillars 24 to the post bake temperature or more, may be performed as necessary. This heat treatment is performed for example, at a temperature of 300 to 450° C. for about 10 minutes. As a result, mask pillars which are greatly superior in heat resistance and chemical resistance can be made, and it becomes possible to use various liquid film forming materials. Besides the low pressure state, the atmosphere for the ultraviolet ray irradiation may be for example, an atmosphere where oxygen and moisture do not substantially exist (for example a nitrogen atmosphere).

Then, as shown in FIG. 1(2), a gate insulating film 26 is formed on the whole surface of the glass substrate 10 except for the mask pillars 24. This gate insulating film 26 can be formed similarly to the base insulation film 12. Then, the mask pillars 24 are removed in order to form first contact holes 28 passing through the gate insulating film 26 as shown in FIG. 1(3).

It is desirable to perform a liquid-repelling treatment for the mask pillars 24 before applying the liquid insulating material for forming the gate insulating film 26. Accordingly, adhering of the liquid insulating material onto the upper surface of the mask pillars 24 can be prevented, and the mask pillars 24 can be easily removed. The liquid-repelling treatment of the mask pillars can be performed by decomposing a gas containing fluorine atoms such as carbon tetrafluoride by a plasma in order to generate active fluorine monoatoms or ions, and bleaching the mask pillars 24 with this active fluorine.

Next, as shown in FIG. 1(4), to cover the gate insulating film 26, a resist 30 is formed. Furthermore, the resist 30 is patterned in order to form an opening section 32 in a position corresponding to a gate electrode. Then, liquid material containing conductive material (for example liquid material with an organic metal compound as the main component) is supplied to the opening section 32, and this is heat treated in order to form a gate electrode 34. Then, the resist 30 is removed. The resist 30 can be made up using a liquid-repelling film.

Here, the liquid material containing the conductive material may be supplied to the opening section 32 by LSMCD, spin coating, slit coating or the like. However, it is preferable to selectively supply to the opening section 32 by for example a quantitative discharge device such as a printer head of an inkjet printer. As a result, the liquid material can be reduced, adhering of the liquid material to the surroundings of the opening section can be prevented, and a gate electrode 34 of the desired thickness can be easily formed.

Next, with the gate electrode 34 as a mask, an appropriate impurity (for example, boron ions in the case where a p-type conductive layer is formed) are impinged onto the polysilicon film 14, in order to form a source region 16 and a drain region 18 as shown in FIG. 1(5) and form a channel region 20 matching with the gate electrode 34. Then, as shown in FIG. 1(5), a resist film 36 which is a mask material is formed on the whole of the glass substrate 10. Furthermore, the resist film 36 is exposed and developed by using a photolithographic method.

Then, as shown in FIG. 2(1), mask pillars 40 comprising the resist film 36 are formed on the positions corresponding to the first contact holes 28 which become contact hole forming regions, and on a predetermined position of the gate electrode 34. Of these mask pillars 40, the ones on the positions corresponding to the source region 16 and the drain region 18 on the polysilicon film 14, have their lower ends in contact with the upper surfaces of the source region 16 and the drain region 18 via the first contact holes 28. A curing process is performed for these mask pillars 40 as necessary, similarly to as mentioned before.

Furthermore, as shown on the right side in FIG. 2(1), the mask pillar 40 may be formed such that the part above the gate insulating film 26 is larger than the first contact hole 28. As a result, as described later, a step is formed in the contact hole which is formed by removal of the mask pillar (refer to the FIG. 1(2)), and the step coverage of the contact hole is improved, so that disconnection inside the contact hole can be prevented.

Next, as shown in FIG. 2(2), an insulating film 42 comprised of silicon dioxide or the like, is formed on the surroundings of the mask pillars 40, that is, on the whole surface of the glass substrate 10 except for the mask pillars 40. This insulating film 42 can be formed similarly to the base insulation film 12 and the like, by applying a liquid insulating material by LSMCD, spin coating, slit coating or the like, and then heat treating this. As a result, flattening of the surface becomes possible. Then, the mask pillars 40 are removed by ashing, and second contact holes 44 are formed in the insulating film 42. At this time, the first contact holes 28 are also penetrated. Besides the application method using the liquid material, it is also possible to form the insulating film 42 for example by sputtering or the like.

Next, as shown in FIG. 2(3), liquid contact forming material with an organic metal compound as the main component, is supplied to the contact holes 28 and 44, by using a quantitative discharge device (not shown). Then, the liquid contact forming material inside the contact holes 28 and 44 is baked and solidified, in order to make contact plugs 46. When the contact holes 28 and 44 are pierced, it is preferable to irradiate ultraviolet rays onto the whole substrate and to perform lyophilic treatment of the bottom of the first contact holes 28, that is, the contact plug forming region of the source region 16, the drain region 18, and the gate electrode 34, which becomes the first conducting section. By performing the lyophilic treatment of these, adhesiveness and bondability with the contact plugs 46 are increased, so that the electrical resistance can be reduced.

Furthermore, a resist 48 is formed to cover the insulating layer 42. Then ultraviolet rays are irradiated onto the resist 48 via a mask (not shown) for patterning, and wiring trenches 50 are formed in the resist 48. Then, for example, a liquid wiring material where ITO fine powders or metal microparticles constituting a transparent conducting layer are dispersed in organic solvent, is supplied to the wiring trenches 50 using a quantitative discharge device, and this is then heat treated in order to form wiring 52 which becomes a second conducting section. As a result, the source region 16, the drain region 18, and the gate electrode 34 which are the first conducting section, and the wiring 52 which is the second conducting section are electrically connected via the contact plugs 46 provided in the contact holes. It is also possible to form this wiring 52 integrally with transparent electrodes of a liquid crystal panel (not shown). Next, the resist 48 is removed (refer to FIG. 2(4)). Then, a passivation film such as silicon dioxide, silicon nitride (SiN) or the like is formed to cover the wiring 52.

The same or different types of material can be adopted as the conductive material for forming the contact plugs 46 and the wiring 52. Moreover, the contact plugs 46 and the wiring 52 may be formed in the same steps. That is to say, the wiring 52 can be formed in the wiring trenches 50 while filling the conductive material into the contact holes 28 and 44. In this case, the same material is used for the conductive material for forming the contact plugs 46 and the wiring 52.

In this manner, in the embodiment, the contact holes are formed by providing the mask pillars in the forming positions for the contact holes, and then forming the insulating film around the mask pillars and removing the mask pillars. Therefore, in the embodiment, the contact holes can be formed without etching the insulating film, so that an expensive vacuum device is not needed, the number of steps can be reduced, and the steps can be simplified. Moreover, the contact holes can be quickly formed, labor and energy for forming the contact holes can be reduced, and the cost of electronic devices can be reduced. Furthermore, in the embodiment, since the mask pillars 40 are removed in order to form the contact holes, and the liquid plug forming material is supplied only to the contact holes, the usage amount of the forming material for the contact holes can be greatly reduced.

Figure 3:
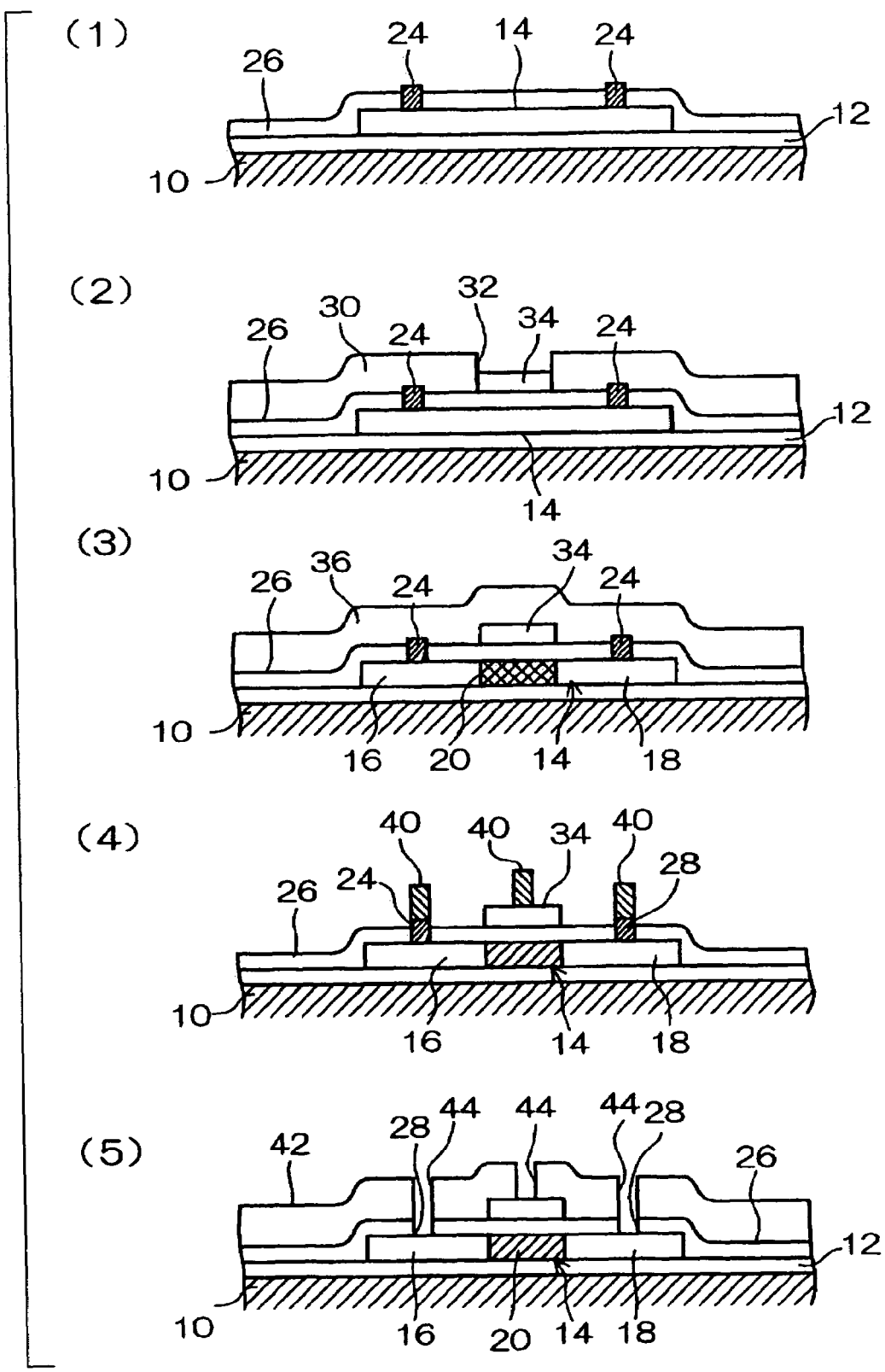
FIG. 3 is a flowchart of the main parts of a contact hole forming method of a second embodiment.

FIG. 3 is a flowchart of the main parts, for explaining a contact hole forming method of a second embodiment. In FIG. 3, firstly, similarly to the first embodiment described above, a base insulation film 12 is formed on the surface of a glass substrate 10, and a polysilicon film 14 is provided thereon. Then, to cover the polysilicon film 14 and the base insulation film 12, a resist film is formed (not shown in the drawing). Next, the resist film is exposed and developed to form mask pillars 24 in positions where the contact holes are planned to be formed on the polysilicon film 14 as shown in FIG. 3(1). Then, after curing treatment and liquid-repelling treatment for the mask pillars 24, a gate insulating film 26 comprising silicon dioxide or the like is formed on the surroundings of the mask pillars 24.

Then, as shown in FIG. 3(2), in the state where the mask pillars 24 are left, a resist 30 is formed on the gate insulating film 26. Then, ultraviolet rays are irradiated onto the resist 30 via a mask (not shown) for patterning, in order to form an opening section 32 on the resist 30. Next, liquid electrode material is poured into the opening section 32, and then baked in order to form a gate electrode 34 on the gate insulating film 26. Then, the resist 30 is removed.

Next, with the gate electrode 34 as a mask, an impurity is implanted into the polysilicon film 14 in order to form a source region 16 and a drain region 18, as shown in FIG. 3(3). Then, a resist film 36 is formed to cover the gate electrode 34 and the gate insulating film. The resist film 36 is then exposed and developed for patterning in order to form mask pillars 40 on the mask pillars 24 and on a predetermined position of the gate electrode 34. Then, curing treatment and liquid-repelling treatment are performed for the mask pillars 40. Next, as shown in FIG. 3(5), an insulating film 42 is formed on the surroundings of the mask pillars 40. Then, the mask pillars 40 and 24 are removed in order to form second contact holes 44 in the insulating layer 42, and to form first contact holes 28 in the gate insulating film 26 thereunder. Thereafter, the abovementioned steps of FIGS. 2(3) and (4) are performed in order to complete the TFT.

In this manner, in the contact forming method of this second embodiment, since the mask pillars 24 provided when forming the gate insulating film 26 are removed together with the mask pillars comprising the resist film 36, the steps can be further simplified.

Figure 4:
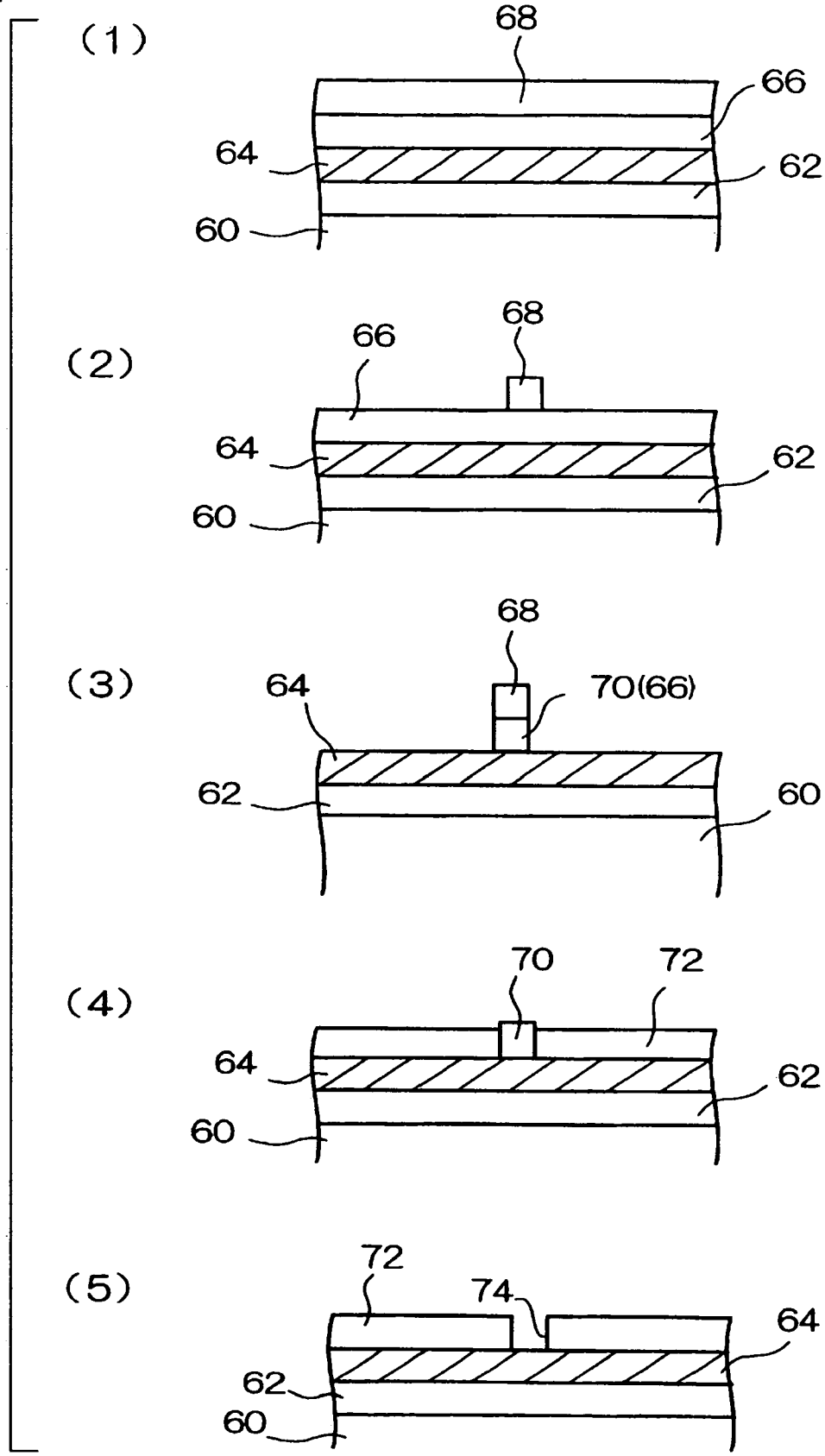
FIG. 4 is a flowchart of a contact hole forming method of a third embodiment.

FIG. 4 is a flowchart for explaining a contact hole forming method of a third embodiment, being a flowchart for forming contact holes by so-called photoetching. In this third embodiment, as shown in FIG. 4(1), a silicon film 64 dispersed with impurities and which becomes a first conducting section, is already formed via an insulating film 62 on the upper surface of a substrate 60 of a silicon wafer, glass, or the like.

Consequently, in the contact hole forming method of this third embodiment, as shown in FIG. 4(1), at first, mask material film 66 comprising inorganic material such as aluminum (Al), copper (Cu), or the like, is film formed on the silicon film 64. This mask material film 66 comprising inorganic material is formed by vacuum deposition, physical deposition such as sputtering, or chemical deposition such as CVD.

Next, photoresist is applied onto the mask material film 66 and dried in order to form a resist film 68. Then, the resist film 68 is exposed and developed by a photolithographic method to leave the resist film 68 only in the positions corresponding to the contact hole forming regions on the mask material film 66 as shown in FIG. 4(2). The substrate 60 is then soaked into an etchant capable of dissolving the mask material film 66 to etch the mask material film 66. As a result, as shown in FIG. 4(3), the mask material 66 is left as a mask pillar 70 only under the resist film 68.

Next, after removing the resist film 68 by ashing or the like, as shown in FIG. 4(4), an insulating film 72 is formed on the whole surface of the substrate 60 except for the mask pillar 70. Subsequently, in the state where the mask pillar is 70 formed, heat treatment is performed on the insulating film 72 in order to cure the insulating film 72. Then, the substrate 60 provided with the insulating film 72 is soaked in an etchant to etch and remove the mask pillar 70 being the mask material. As a result, as shown in FIG. 4(5), a contact hole 74 passing through the insulating film 72 is formed. Then, similarly to the above, a wiring layer (not shown) is formed on the insulating film 72, and this wiring layer and the silicon film 64 are electrically connected via a contact plug or the like provided in the contact hole 74.

In this manner, by using a mask material comprising an inorganic material, and selecting a contact material corresponding to the material of the first conducting section, damage to the lower conducting section due to etching for forming the contact holes can be eliminated. Therefore, adhesiveness and bondability with the conductive material arranged inside the contact hole, are improved so that the connection resistance can be reduced. Moreover, when etching for forming the mask pillar 70, even in the case of so-called over etching, the lower silicon film 64 is not damaged, and the mask pillar 70 is formed in a rather small size. Therefore, since the contact hole 74 formed by this mask pillar 70 is only formed in a rather small size, there is little likelihood of causing breakdown voltage deficiency, or a short circuit with another conducting section.

In the case where an organic material such as non-photosensitive polyimide is used for the mask material, the mask material film is formed by the organic material, and the mask pillar can be formed by subjecting this to the above-mentioned photoetching, so that the contact hole can be formed.

FIG. 5 is an explanatory diagram of a fourth embodiment. In the contact hole forming method of this embodiment, liquid mask material 82 is applied by a quantitative discharge device 80 such as a printer head of an inkjet printer, in order to form a mask material. In this case, the liquid mask material 82 is selectively supplied only to a contact hole forming region 88 of a lower conducting section (first conducting section) 86 formed for example, on an insulating substrate 84. Then, by solidifying the liquid mask material 82 supplied to the contact hole forming region 88, a mask material is formed in the contact hole forming region 88.

In this case, before applying the liquid mask material 82 to the contact hole forming region 88, it is desirable to perform a surface treatment process for making the contact hole forming region 88 lyophilic and making its surroundings 90 liquid-repelling. As a result, the liquid mask material 82 can be prevented from outspreading to the surroundings 90 of the contact hole forming region 88. Moreover, the wettability of the liquid mask material with respect to the contact hole forming region 88 is increased and the adhesiveness of the liquid mask material is increased, so that the supply amount of the liquid mask material to the contact hole forming region 88 can be increased. The liquid-repelling treatment for the surroundings 90 may be performed by forming a liquid-repelling film such as a fluoroplastic on the surroundings 90.

The present invention is not limited to the above embodiments, and various modifications can be applied within a scope which does not depart from the scope of the claims. For example, in the respective configurations of the above embodiments, parts can omitted or arbitrarily combined differently from as mentioned above.

What is claimed is:

1. A method of forming a semiconductor device, the method comprising:
   selectively applying a liquid material to a substrate to form a mask on a first part of the substrate;
   forming an insulating film on a second part of the substrate, the insulating film not covering the mask material; and
   removing the mask material to form a hole in the insulating film.

2. The method of forming a semiconductor device according to claim 1, the liquid material being discharged as a droplet from a droplet-ejecting device.

3. The method of forming a semiconductor device according to claim 1, the method further comprising:
   providing a lyophilic treatment to a first region on the substrate before applying the liquid material,
   a lyophilic property of the first region of the substrate against the liquid material being larger than a lyophilic property of a second region of the substrate against the liquid material, the liquid material being applied to the first region in selectively applying the liquid material, the second region of the substrate not being provided with the lyophilic treatment.

4. The method of forming a semiconductor device according to claim 1, the liquid material including an organic material.

5. The method of forming a semiconductor device according to claim 1, the mask material being formed by evaporating the liquid material at a certain temperature.

6. The method of forming a semiconductor device according to claim 1, the mask material being formed by heating the mask material after evaporating the liquid material.

7. The method of forming a semiconductor device according to claim 1, the mask material being formed by irradiating the liquid material with an ultraviolet ray.

8. The method of forming a semiconductor device according to claim 1, forming the insulating film on the substrate including providing a lyophobic treatment with the mask material and applying an insulating liquid material to the substrate to form the insulating film after the lyophobic treatment, the mask material being lyophobic against the insulating liquid material as compared to the mask material before the lyophobic treatment.

9. The method of forming a semiconductor device according to claim 1, forming the insulating film including applying an insulating liquid material to the substrate.

10. The method of forming a semiconductor device according to claim 1, the method further comprising:
    providing a lyophobic treatment to a second region on the substrate before applying the liquid material,
    a lyophobic property of the second region of the substrate against the liquid material being larger than a lyophobic property of a first region of the substrate against the liquid material, the liquid material being applied to the first region in selectively applying the liquid material, the first region of the substrate not being provided with the lyophobic treatment.

11. The method of forming a semiconductor device according to claim 1, the substrate including a glass board and a base insulation film, the base insulation film being formed on the glass board, the mask material being formed on the base insulation film.

12. The method of forming a semiconductor device according to claim 1, the substrate including a base insulation film and a silicon film, the silicon film being formed on the base insulation film, the mask material being formed on the silicon film.

13. The method of forming a semiconductor device according to claim 1, the substrate including a conductive film, the mask material being formed on the conductive film.

14. A method of forming a semiconductor device, the method comprising:
   selectively applying a liquid material to a substrate;
   evaporating the liquid material to form a mask material on a first part of the substrate;
   applying an insulating liquid material to the substrate;
   evaporating the insulating liquid material to form an insulating film on a second part of the substrate, the insulating film not covering the mask material; and
   removing the mask material to form a hole in the insulating film.

15. A method of forming an electric device including the method of forming a semiconductor device according to claim 1.

* * * * *